US012581606B2

(12) United States Patent
Takahashi et al.

(10) Patent No.: US 12,581,606 B2
(45) Date of Patent: Mar. 17, 2026

(54) ELECTRONIC APPARATUS

(71) Applicant: LENOVO (SINGAPORE) PTE. LTD., Singapore (SG)

(72) Inventors: Daisuke Takahashi, Yokohama (JP); Hiroaki Kinoshita, Yokohama (JP); Yalu Liu, Yokohama (JP); Yusuke Onoue, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 261 days.

(21) Appl. No.: 18/615,168

(22) Filed: Mar. 25, 2024

(65) Prior Publication Data

US 2024/0422929 A1    Dec. 19, 2024

(30) Foreign Application Priority Data

Jun. 16, 2023    (JP) .................................. 2023099380

(51) Int. Cl.
*H05K 5/02* (2006.01)
*H05K 7/20* (2006.01)

(52) U.S. Cl.
CPC ....... *H05K 5/0226* (2013.01); *H05K 7/20963* (2013.01); *H05K 5/0247* (2013.01)

(58) Field of Classification Search
CPC .... G06F 1/1681; G06F 1/1616; G06F 1/1652; G06F 1/203; G06F 2200/203; G06F 1/1637; G06F 1/1641; G06F 1/1656; G06F 1/206; G06F 1/16; G06F 1/1615; G06F 1/181; G06F 2200/201; H04M 1/0268; H04M 1/022; H05K 5/0226;

H05K 7/20963; H05K 7/2039; H05K 1/147; H05K 1/189; H05K 2201/10128; H05K 5/0018; H05K 5/0217; H05K 7/20; H05K 7/20509; H05K 1/0209; H05K 7/20154; H05K 5/0247; G09F 9/301; H01B 7/421
See application file for complete search history.

(56) References Cited

U.S. PATENT DOCUMENTS

| | | | | |
|---|---|---|---|---|
| 11,073,863 | B2 * | 7/2021 | Kim | H04M 1/0216 |
| 11,416,040 | B1 * | 8/2022 | Cavallaro | G06F 1/203 |
| 2018/0196469 | A1 * | 7/2018 | Yamauchi | G06F 1/1626 |
| 2020/0060020 | A1 * | 2/2020 | Park | H05K 1/028 |
| 2020/0204666 | A1 * | 6/2020 | Hong | G06F 1/203 |

(Continued)

FOREIGN PATENT DOCUMENTS

| | | |
|---|---|---|
| JP | 2022121092 A | 8/2022 |
| JP | 2023060600 A | 4/2023 |

*Primary Examiner* — Michael A Matey
(74) *Attorney, Agent, or Firm* — SHIMOKAJI IP

(57) ABSTRACT

An electronic apparatus includes a first chassis and a second chassis that are rotatably connected via a hinge device. A graphite sheet is disposed on an inner face of the first chassis to come in contact with a spine component in the 180-degree posture. A graphite sheet is disposed on an inner face of the second chassis to come in contact with a spine component in the 180-degree posture. A flexible board extends across the first and second chassis, and forms substantially S-shaped surplus length absorbing parts having a first folded part and a second folded part that are curved in opposite directions in the chassis. In the graphite sheet, a protective layer at the place where it comes in contact with the surplus length absorbing parts includes a sliding material.

6 Claims, 9 Drawing Sheets

(56)                References Cited

U.S. PATENT DOCUMENTS

| | | | | |
|---|---|---|---|---|
| 2020/0356143 A1* | 11/2020 | Oh | .......................... | G06F 1/1616 |
| 2021/0216105 A1* | 7/2021 | Park | ..................... | G06F 1/1652 |
| 2022/0159881 A1* | 5/2022 | Watanabe | ............... | G06F 1/206 |
| 2022/0232729 A1* | 7/2022 | Ohyama | ............... | G06F 1/1681 |
| 2022/0317741 A1* | 10/2022 | Cavallaro | .............. | G09F 9/301 |
| 2022/0343808 A1* | 10/2022 | Morino | ................. | G06F 1/1616 |
| 2023/0009308 A1* | 1/2023 | Jang | ........................ | G06F 1/203 |
| 2023/0266803 A1* | 8/2023 | Takahashi | ............. | G06F 1/1652 |
| | | | | 361/679.27 |
| 2023/0305602 A1* | 9/2023 | Miyamoto | ............ | G06F 1/1616 |
| 2023/0309249 A1* | 9/2023 | Kinoshita | ............. | G06F 1/1652 |
| 2024/0134415 A1* | 4/2024 | Ohyama | .............. | G06F 1/1616 |
| 2024/0138116 A1* | 4/2024 | Ohyama | .............. | G06F 1/1616 |
| 2025/0208669 A1* | 6/2025 | Lee | ....................... | G06F 1/1683 |

* cited by examiner

ELECTRONIC APPARATUS

BACKGROUND OF THE INVENTION

Field of the Invention

The present invention relates to an electronic apparatus including a first chassis and a second chassis that are rotatably connected via a hinge device.

Description of the Related Art

Recently electronic apparatuses (e.g., PCs and smartphones) that have a touch-panel type liquid crystal display and do not have a physical keyboard have rapidly spread. The display of this type of electronic apparatus is desirably large when in use, but is desired to be compact when not in use. Japanese Unexamined Patent Application Publication No. 2023-060600, for example, discloses an electronic apparatus including a flexible display such as an organic electro luminescence (EL), thus configuring the display that is foldable at a position between the chassis.

The electronic apparatus described in Japanese Unexamined Patent Application Publication No. 2023-060600 has a processing device that generates heat and is installed in the first chassis, and a battery device that generates less heat and is installed in the second chassis, so that a thermal imbalance occurs between the chassis. This electronic apparatus therefore includes a graphite sheet on each inner face of the first and second chassis, so that heat is transported between the graphite sheets on the chassis via a spine component that is made of a thermal-conductive material and makes up the hinge device.

An electric apparatus may be required to exchange a large amount of information between the chassis. In this case, too thick wiring is required, and thus a flexible board can be used instead of typical wiring. The wiring between the chassis expands and contracts due to the circumferential length difference that occurs during rotational movement of the chassis. Japanese Unexamined Patent Application Publication No. 2022-121092 therefore describes a flexible board with a substantially S-shaped folded part to absorb a change in path length due to the relative rotation of the chassis.

SUMMARY OF THE INVENTION

Graphite sheets typically have a protective film on the surface to protect the graphite component. Polyethylene terephthalate (PET) is often used as the protective film due to its strength, dimensional stability, chemical stability, and insulation properties.

When a flexible board as described in Japanese Unexamined Patent Application Publication No. 2022-121092 is used in the electronic apparatus described in Japanese Unexamined Patent Application Publication No. 2023-060600, abnormal noise may be caused by sliding between the graphite sheets made of PET that are protective films and the flexible board when the first and second chassis are rotated relatively.

In view of the problems of the conventional techniques, the present invention aims to provide an electronic apparatus capable of transporting heat between the chassis without generating abnormal noise.

To solve the above problems and achieve the aim, an electronic apparatus according to the first aspect of the present invention includes a first chassis and a second chassis that are rotatably connected via a hinge device, the hinge device connecting the first chassis and the second chassis in a relatively rotatable manner between a first posture where the first chassis and the second chassis are stacked to be overlaid in their surface normal directions and a second posture where the first chassis and the second chassis are placed side by side in the direction perpendicular to the surface normal directions; a spine component including a thermal-conductive material, and extending along a first edge of the first chassis, the first edge being adjacent to the second chassis, and a second edge of the second chassis, the second edge being adjacent to the first chassis, the spine component covering a gap between the first edge and the second edge in the first posture, and straddling the first edge and the second edge in the second posture; a first heat transfer sheet disposed on an inner face of the first chassis, the first heat transfer sheet coming in contact with the spine component in the second posture; and a second heat transfer sheet disposed on an inner face of the second chassis, the second heat transfer sheet coming in contact with the spine component in the second posture, the first heat transfer sheet and the second heat transfer sheet each including a heat-transfer material layer and a protective layer, the protective layer extending over an entire surface of the corresponding heat transfer sheet that faces the spine component and including a sliding material, the protective layer and the spine component coming in contact.

The above-described aspect of the present invention enables heat transportation between the chassis without generating abnormal noise.

DETAILED DESCRIPTION OF THE INVENTION

The following describes an electronic apparatus according to one embodiment of the present invention in details, with reference to the drawings. The present invention is not limited to the following embodiment.

Figure 1:
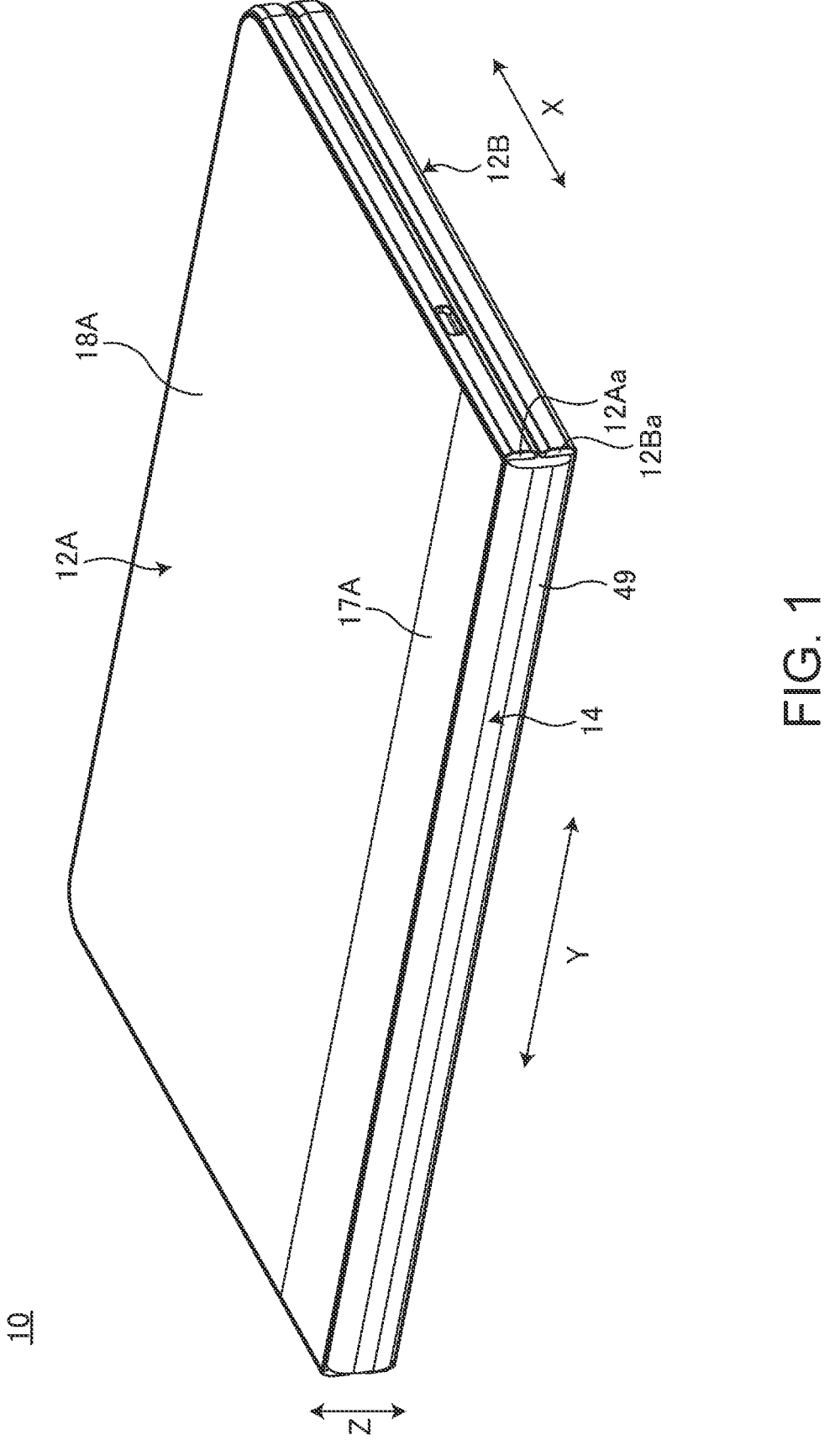
FIG. 1 is a perspective view of an electronic apparatus according to one embodiment when the electronic apparatus is closed to have a 0-degree posture.
Figure 2:
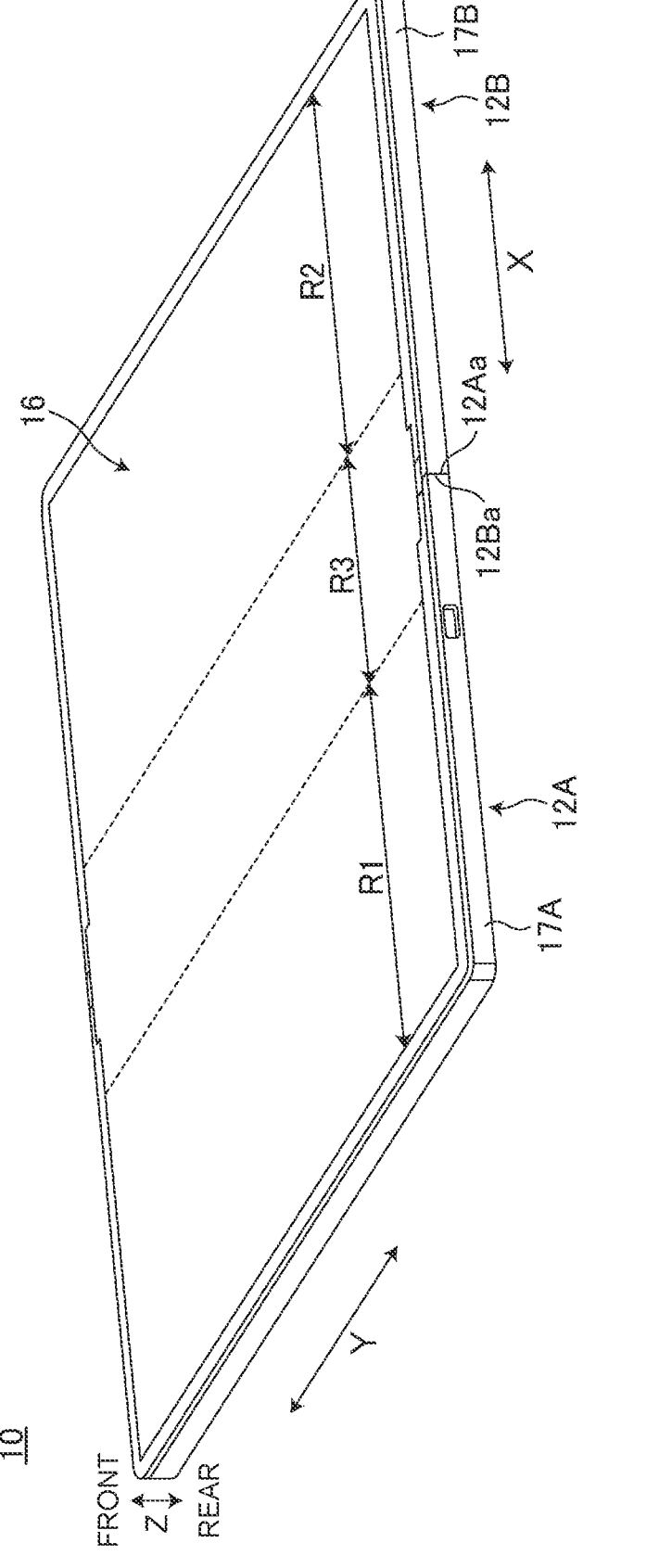
FIG. 2 is a plan view schematically illustrating the electronic apparatus that is opened to a 180-degree posture.

FIG. 1 is a perspective view of an electronic apparatus 10 according to one embodiment when the electronic apparatus 10 is closed to have a 0-degree posture. FIG. 2 is a plan view schematically illustrating the electronic apparatus 10 of FIG.

Figure 3:
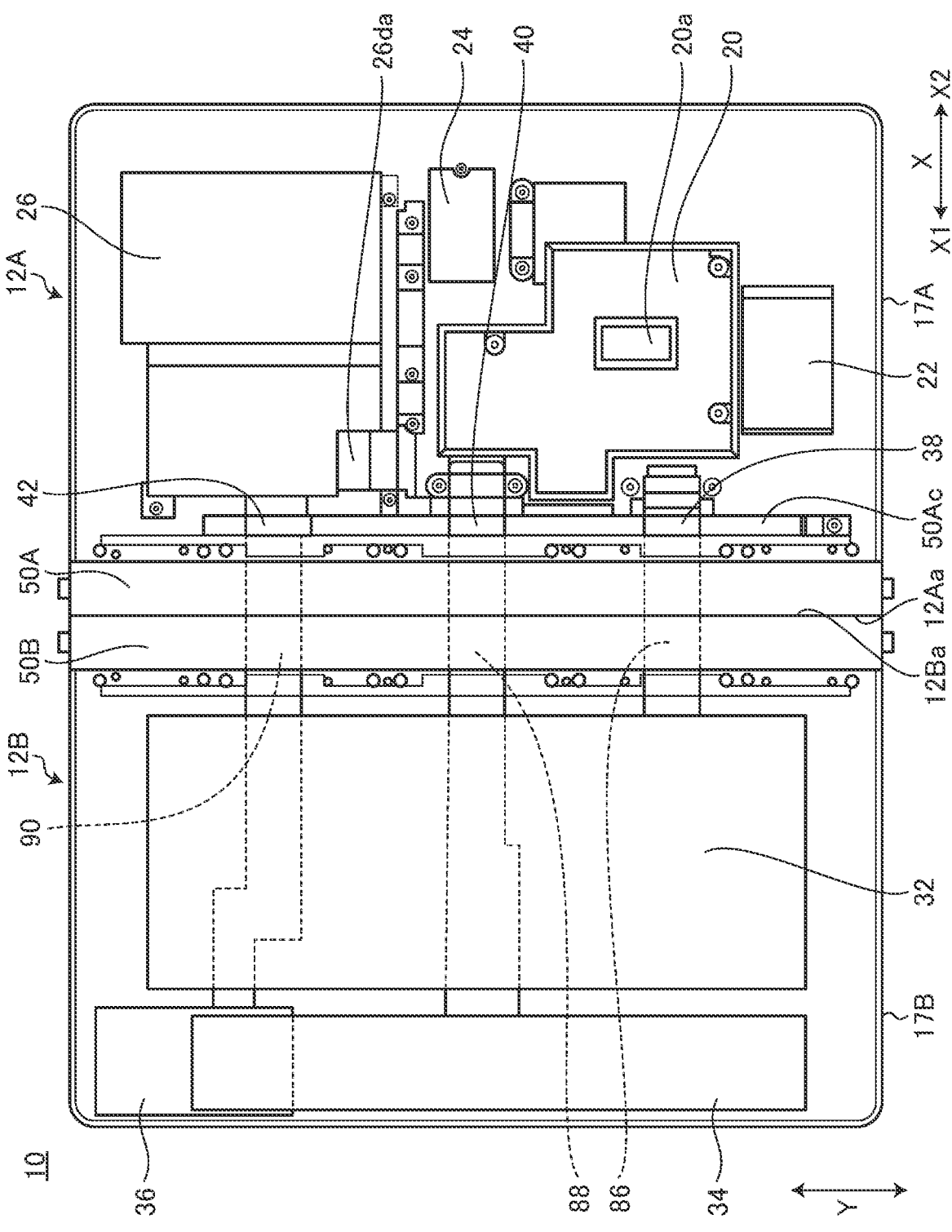
FIG. 3 is a plan view schematically illustrating the internal configuration of the electronic apparatus.
Figure 4:
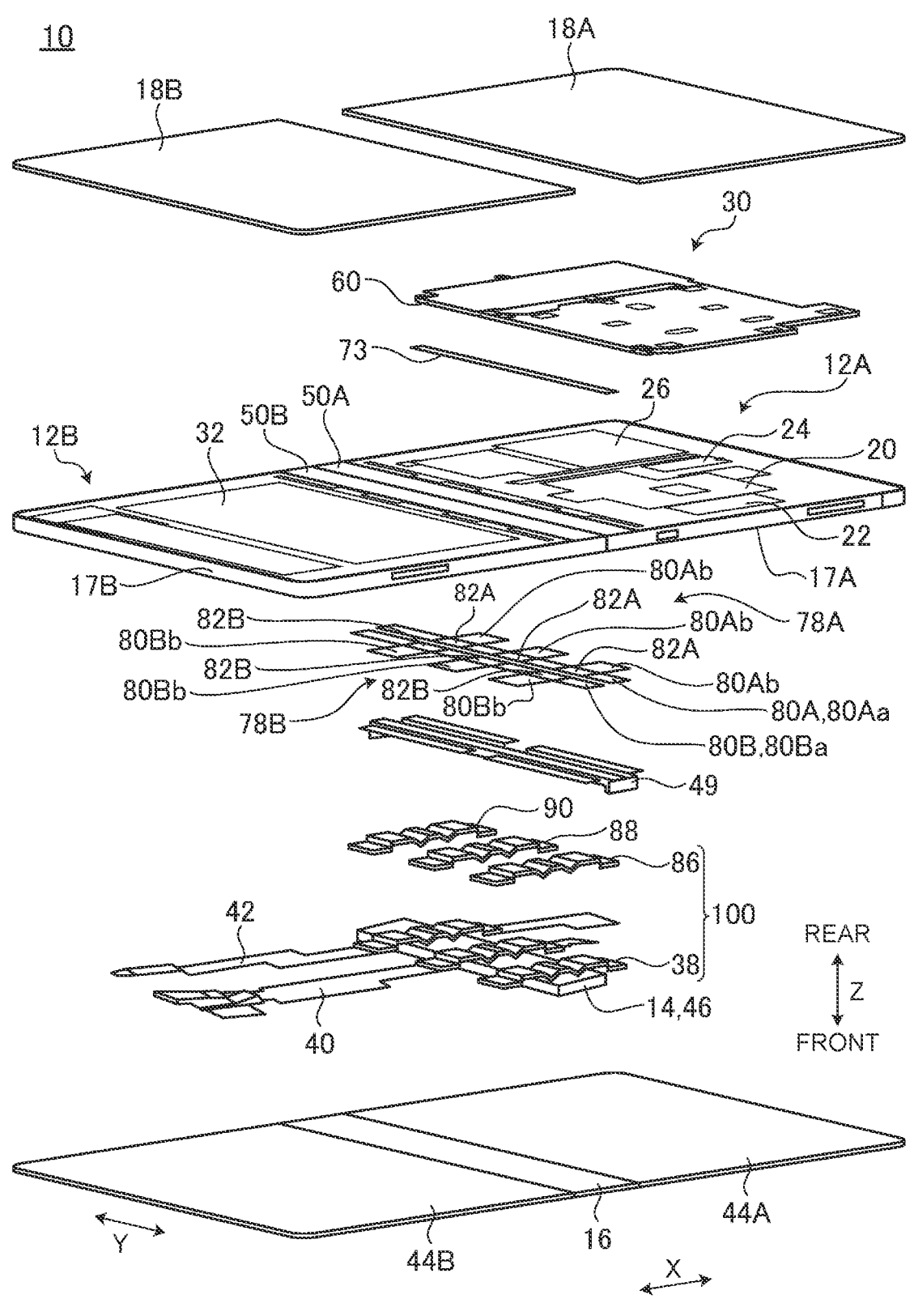
FIG. 4 is an exploded perspective view of the electronic apparatus.
Figure 5:
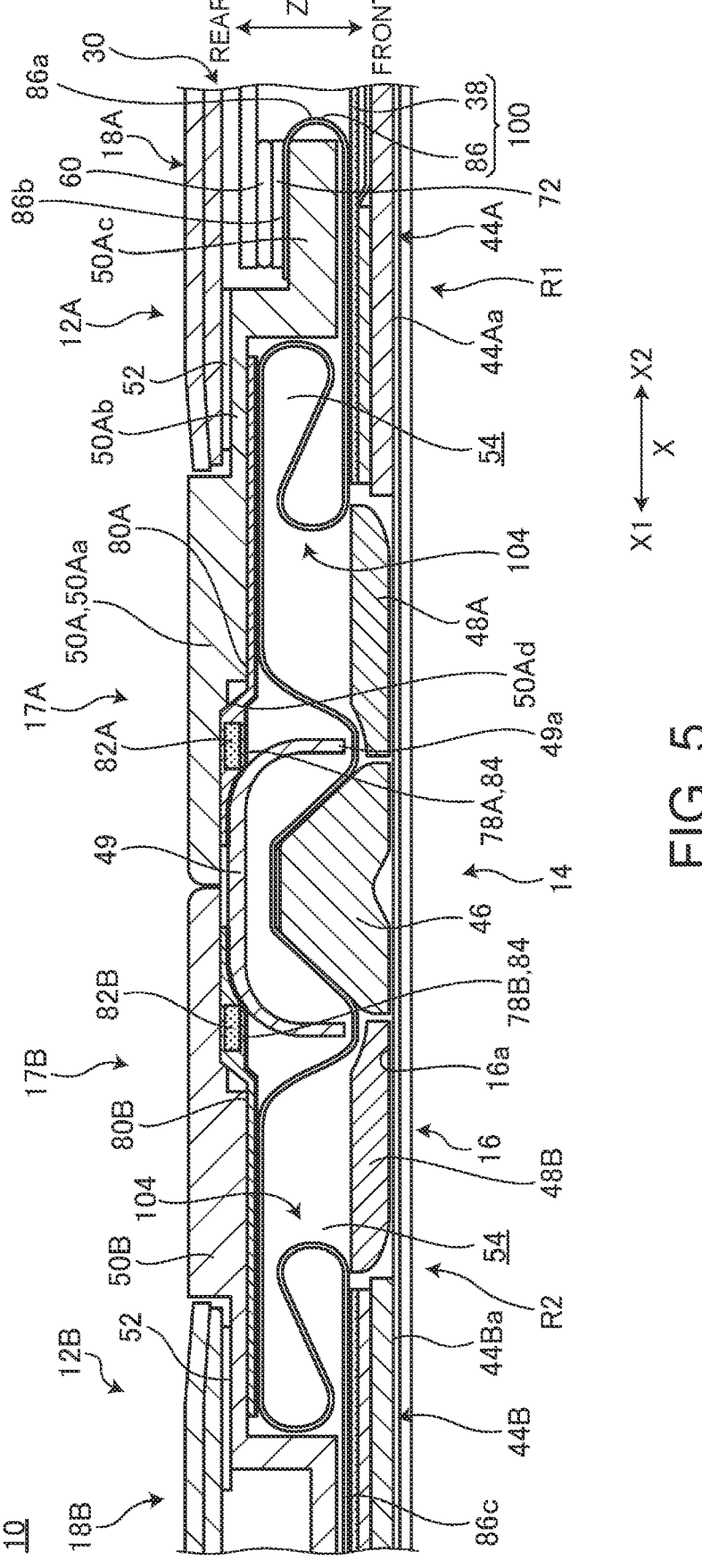
FIG. 5 is a cross-sectional view of the hinge device and its surroundings when the electronic apparatus is in the 180-degree posture.
Figure 6:
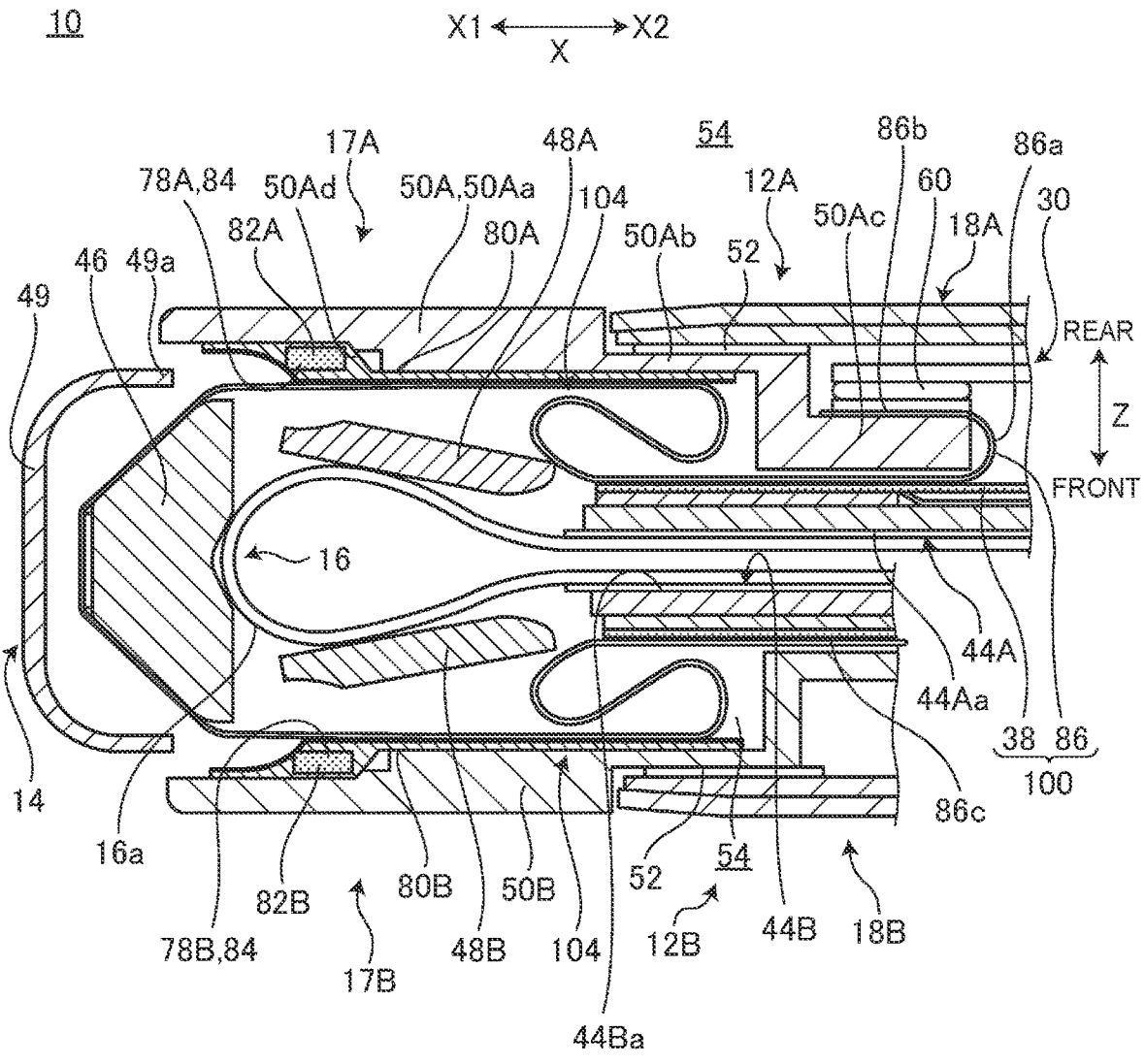
FIG. 6 is a cross-sectional view of the hinge device and its surroundings when the electronic apparatus is in the 0-degree posture.

1 that is opened to a 180-degree posture. FIG. 3 is a plan view schematically illustrating the internal structure of the electronic apparatus 10 of FIG. 2. FIG. 3 illustrates the electronic apparatus, from which cover members 18A and 18B and a thermal module 30 have been removed. FIG. 4 is an exploded perspective view of the electronic apparatus 10. FIG. 5 is a cross-sectional view of a hinge device 14 and its surroundings when the electronic apparatus is in the 180-degree posture. FIG. 6 is a cross-sectional view of the hinge device 14 and its surroundings when the electronic apparatus is in the 0-degree posture.

As illustrated in FIGS. 1 to 4, the electronic apparatus 10 includes a first chassis 12A, a second chassis 12B, a hinge device 14, and a display 16. The display 16 extends over the chassis 12A and 12B. The present embodiment describes the electronic apparatus 10 by way of an application example of a tablet PC or a laptop PC that is foldable like a book. The electronic apparatus 10 may have a configuration, in which two chassis are connected to be relatively rotatable.

The chassis 12A and 12B are placed adjacent to each other. The first chassis 12A includes a frame member 17A and a cover member 18A. The frame member 17A is a rectangular frame member with standing walls on three sides except for the first end 12Aa, which is adjacent to the second chassis 12B. The cover member 18A is a plate-like member that closes the rear opening of the frame member 17A (see also FIG. 5). Similarly, the second chassis 12B includes a frame member 17B and a cover member 18B. The frame member 17B has standing walls on three sides other than the second end 12Ba adjacent to the first chassis 12A, and the cover member 18B closes the rear opening of the frame member 17B. The surface openings of the frame members 17A and 17B are closed by a display 16.

For instance, these members 17A, 17B, 18A, and 18B are metal members made of stainless steel, magnesium, and aluminum or fiber reinforced resin plates containing reinforced fibers such as carbon fibers. That is, these members 17A, 17B, 18A, and 18B are made of thermal-conductive materials and have appropriate heat conductivity.

The hinge device 14 connects the chassis 12A and 12B in a relatively rotatable manner between the 0-degree posture and the 180-degree posture. The hinge device 14 also functions as a spine that hides the gap between the ends 12Aa and 12Ba, the gap being formed in the 0-degree posture illustrated in FIG. 1.

For the electronic apparatus 10, the following refers to the direction of placing the chassis 12A and 12B side by side as X direction, the direction orthogonal to X direction and along the ends 12Aa and 12Ba as Y direction, and the thickness direction of the chassis 12A and 12B as Z direction. For the Z direction, the side where the display 16 is placed is referred to as the surface, and the side where the cover members 18A and 18B are placed is referred to as the back face. For the first chassis 12A and its components only, the side close to the end 12Aa in the X direction is referred to as the X1 side, and the opposite side is referred to as the X2 side.

For the angular posture between the chassis 12A and 12B, the following refers to the stacking state in which the chassis are overlaid to be stacked in the surface normal direction as a 0-degree posture (first posture, see FIG. 1), and the state of placing the chassis side by side in the direction (X direction) perpendicular to the surface normal direction as a 180-degree posture (second posture, see FIGS. 2 and 3). The postures between 0 degree and 180 degrees can be referred to with corresponding angles. For example, the posture where the surface normal directions of the chassis 12A and 12B are orthogonal to each other is a 90-degree posture. These angles are for convenience of explanation, and the actual product may have an angular position that deviates slightly from the exact angular position indicated by the angle.

As illustrated in FIG. 3, the first chassis 12A accommodates a motherboard 20, a communication module 22, a solid state drive (SSD) 24, and a battery device 26. The first chassis 12A comes with a thermal module 30 (see FIG. 4).

The thermal module 30 is a heat dissipator that receives heat from heat-generating electrical components including the CPU 20a, the communication module 22, and the SSD 24, and diffuses and radiates the heat over a wide area, and includes a vapor chamber, a graphite sheet, and one or more heat pipes. As indicated by reference numeral 60 in FIG. 4, one of the heat pipes is placed along the X1-side edge of the thermal module 30, so that the heat of the heating elements is transported to the heat pipe 60.

For instance, electronic components such as a central processing unit (CPU) 20a are mounted on the motherboard 20. The CPU 20a is a processor that performs calculations related to the main control and processing of the electronic apparatus 10. The CPU 20a is a heating element with a largest amount of heat generated among the electronic components mounted in the electronic apparatus 10. For instance, the communication module 22 processes information for wireless communication that is exchanged via an antenna mounted on the second chassis 12B. For instance, the communication module 22 supports a wireless WAN and a fifth generation mobile communication system. The SSD 24 is a storage device that includes a semiconductor memory. The first chassis 12A accommodates various types of electronic components other than the motherboard 20. The communication module 22 and SSD 24 are the second largest heat-generating elements after the CPU 20a. The battery device 26 is a secondary cell that is a sub-power source of the electronic apparatus 10.

The second chassis 12B accommodates a battery device 32, a display board 34, and a sub-card 36. The battery device 32 is a secondary cell that is a main-power source of the electronic apparatus 10. The battery device 32 is larger than the battery device 26 described above, and occupies most of the interior of the second chassis 12B. The display board 34 is a control board for the display 16. The sub-card 36 is a board that mounts a power button and an external connector that conforms to the universal serial bus (USB) standard, for example. The second chassis 12B accommodates various types of electronic components in addition to the battery device 32 and other components.

The battery device 32, display board 34, and sub-card 36 are connected to the motherboard 20 using flexible boards (flat cables, flexible printed circuits (FPC)) 38, 40, and 42 that each extend across the ends 12Aa and 12Ba. Hereafter, these flexible boards 38, 40, and 42 will also be referred to as a flexible board 38 as representative when no particular distinction is necessary.

The amount of heat generated by the battery device 32, display board 34, and sub-card 36 is smaller than that of the CPU 20a, for example. This means that the electronic apparatus 10 generates a larger amount of heat in the first chassis 12A than in the second chassis 12B. Thus, the electronic apparatus 10 is configured to promote heat transfer between the left and right chassis 12A and 12B and to equalize the heat in the chassis 12A and 12B. To this end, the electronic apparatus 10 includes thermal-conductive members 78A and 78B (see FIG. 4) and graphite sheets 86, 88, and 90 (see FIG. 4). The graphite sheets 86, 88, and 90 are stacked on and bonded to a part of the flexible boards 38, 40, and 42, respectively.

In the 0-degree posture illustrated in FIGS. 1 and 6, the chassis 12A and 12B are folded to be overlapped on top of one another. The display 16 is a paper-like flexible display including organic electro luminescence (EL). The display 16 has a region R1 on the first chassis 12A and a region R2 on the second chassis 12B, as illustrated in FIG. 2. In the 0-degree posture, these regions R1 and R2 are opposed to each other, and a bendable region R3 that is a boundary region between the regions R1 and R2 is bent in an arc shape. In the 180-degree posture illustrated in FIGS. 2 and 5, the chassis 12A and 12B are placed side by side to the left and right. In this posture, the display 16 has a single flat plate shape as a whole, where the regions R1 and R2 and the bendable region R3 are placed side by side on the XY plane.

Of the display 16, the region R1 is relatively fixed to the first chassis 12A, and the region R2 is relatively fixed to the second chassis 12B. Specifically, as illustrated in FIG. 5, the rear face 16a of the region R1 is fixed to the first chassis 12A via a first plate 44A, and the rear face 16a of the region R2 is fixed to the second chassis 12B via a second plate 44B.

As illustrated in FIG. 5, these plates 44A and 44B are placed on the left and the right of the hinge device 14, and have their surfaces 44Aa and 44Ba that support the display 16. The rear face 16a of the display 16 is adhesively fixed in the region R1 to the surface 44Aa of the first plate 44A, and is adhesively fixed in the region R2 to the surface 44Ba of the second plate 44B. The plates 44A and 44B each include a carbon fiber-reinforced resin plate made of carbon fibers impregnated with a matrix resin such as an epoxy resin, and a metal frame made of a magnesium alloy that surrounds the outer periphery of the rear face of this carbon fiber-reinforced resin plate.

The bendable region R3 of the display 16 is movable relative to the chassis 12A and 12B. In the 180-degree posture, the rear face 16a of the bendable region R3 is supported by the hinge device 14 (see FIG. 5). In the 0-degree posture, the bendable region R3 is bent like an arc. A part of the rear face 16a is supported by the hinge device 14, and most of the rear face 16a is separated from the hinge device 14 (see FIG. 6).

As illustrated in FIGS. 5 and 6, the hinge device 14 of the present embodiment includes a hinge body 46, a first support plate 48A and a second support plate 48B.

The hinge body 46 is located across the ends 12Aa and 12Ba of the chassis 12A and 12B, and extends along the ends 12Aa and 12Ba over substantially the entire length in Y direction. The hinge body 46 has a cross section that is symmetrical between the first chassis 12A and the second chassis 12B, and the cross section has a trapezoidal shape defined with two slopes 46a and a top surface 46b between them. The hinge body 46 is a block-like component made of metal such as aluminum. The hinge body 46 is supported by two hinge shafts that are aligned in the X direction in the 180-degree posture.

As illustrated in FIGS. 1 and 5, a spine component 49 is attached to an outer face of the hinge body 46. The spine component 49 is a substantially U-shaped plate that matches the external shape of the hinge body 46. The spine component 49 is made of a thermal-conductive material such as aluminum alloy or stainless steel, for example. The spine component 49 is a decorative cover that enhances the external quality. The flexible boards 38, 40, and 42 pass between the hinge body 46 and the spine component 49 at the position where they straddle the ends 12Aa and 12Ba.

In the 180-degree posture illustrated in FIG. 5, the hinge body 46 is housed in the chassis 12A and 12B, and straddles the adjacent ends 12Aa and 12Ba in X direction. In the 0-degree posture illustrated in FIG. 6, the hinge body 46 is placed to close the gap formed between the ends 12Aa and 12Ba that are largely separated from each other. In this posture, the spine component 49 is placed on the outermost surface, which prevents deterioration of the appearance design of the folded electronic apparatus 10 (see FIG. 1).

That is, the spine component 49 covers the gap formed between the chassis 12A and 12B in an angular position other than 180 degrees (e.g., a 0-degree posture or a 90-degree posture) (see FIGS. 1 and 6). With this configuration, the spine component 49 prevents the internal components of the chassis 12A and 12B from being exposed to the exterior through this gap. In the 180-degree posture, the spine component 49 is placed to straddle the mutually adjacent ends 12Aa and 12Ba in X direction and be stored in the chassis 12A and 12B (see FIG. 5).

Next, the support plates 48A and 48B are plates made of aluminum or other metallic materials and are symmetrical in shape. These support plates 48A and 48B are placed to be opposed to the surface of the chassis 12A and 12B and extend along the ends 12Aa and 12Ba over substantially the entire length in Y direction.

The first support plate 48A is placed between the first plate 44A and the hinge body 46. The first support plate 48A has an edge close to the first plate 44A, and is connected so that this edge is rotatable relative to a predetermined bracket via the rotary shaft. The first support plate 48A has an edge close to the hinge body 46, and this edge is movable relative to the hinge body 46. The configuration, mounting structure, and others of the second support plate 48B are symmetrical with those of the first support plate 48A, so a detailed explanation is omitted.

The support plates 48A and 48B swing with the rotation of the chassis 12A and 12B. In the 180-degree posture, the surfaces of the support plates 48A and 48B support the rear face 16a of the display 16 in the bendable region R3. In angular postures other than 180 degrees, the support plates 48A and 48B keep a gap from the display 16 or are in contact with the display 16 while applying a small force that does not deform the display 16 (see FIG. 6). The support plates 48A and 48B may be configured to support the bendable region R3 of the display 16 also in angular postures other than 180 degrees to correct its shape. In this way, the support plates 48A and 48B stably support the bendable region R3 of the display 16 with a plane when the electronic apparatus has the 180-degree posture, while not interfering with the bending motion of the bendable region R3.

The following describes a connecting edge 50A along the end 12Aa of the frame member 17A. In the 180-degree posture (see FIG. 5), the connecting edge 50A is substantially symmetrical and adjacent to the connecting edge 50B along the end 12Ba of the frame member 17B in the X direction. In the 0-degree posture (see FIG. 6), the connecting edge 50A and the connecting edge 50B are substantially symmetrical and are opposed in the Z direction. The connecting edges 50A and 50B are substantially symmetrical in shape, and thus only the connecting edge 50A will be described below.

The connecting edge 50A is a part of the frame member 17A, and has appropriate heat conductivity as described above. The connecting edge 50A has a back-face defining part 50Aa, a middle step 50Ab, and a lower step 50Ac. The back-face defining part 50Aa defines the back face of the first chassis 12A in a region between the end of the cover member 18A and the end 12Aa of the first chassis 12A. The connecting edge 50A has a step 50Ad that is lower on the X1-side inner face of the back-face defining part 50Aa.

The middle step 50Ab extends from the back-face defining part 50Aa toward the X2 side. The cover member 18A is fixed to the middle step 50Ab with adhesive tape 52. The back-face defining part 50Aa and the middle step 50Ab have a step therebetween, so that the back-face defining part 50Aa and the cover member 18A form a substantially flush surface.

The lower step 50Ac is located slightly close to the surface side from the middle step 50Ab and further extends to the X2 side. A portion of the thermal module 30 is fixed to the lower step 50Ac. In FIG. 5, a space 54 is formed on the surface side of the middle step 50Ab and on the X1-side of the lower step 50Ac. In this space 54, a part of the flexible board 38 is housed in an inverted S-shape. Also in a symmetrical position of the second chassis 12B, a similar space is formed, and a part of the flexible board 38 is stored there in an S-shape. This allows the flexible board 38 to follow the change in shape of the electronic apparatus 10 from the 0-degree to 180-degree posture without difficulties.

As illustrated in FIGS. 4 and 5, the electronic apparatus 10 includes the first thermal-conductive member 78A in the chassis 12A, and the second thermal-conductive member 78B in the second chassis 12B. The first thermal-conductive member 78A includes a graphite sheet (first heat transfer sheet) 80A and a cushion member 82A. The second thermal-conductive member 78B includes a graphite sheet (second heat transfer sheet) 80B and a cushion member 82B. These thermal-conductive members 78A and 78B are placed substantially symmetrically. The graphite sheets 80A and 80B and graphite sheets 73, 86, 88, and 90, which will be described later, are each prepared by covering a graphite layer 108 (see FIG. 9) in which graphite, which is an allotrope of carbon, is processed into a sheet shape, with a protective layer 106. These sheets have high thermal conductivity. The graphite sheets 80A, 80B, 73, 86, 88, 90 are thin, flexible sheets.

As illustrated in FIG. 4, the graphite sheet 80A, 80B includes a sheet 80Aa, 80Ba extending in the Y direction, and three sheets 80Ab, 80Bb protruding in the X direction perpendicular to the sheet 80Aa, 80Ba. The sheet 80Aa is along the edge 12Aa, and the sheet 80Ba is along the edge 12Ba. The sheet 80Ab and sheet 80Bb protrude in opposite directions.

The cushion members 82A and 82B are made of a material that is flexible and has a certain degree of repulsion, such as rubber or sponge. The cushion members 82A and 82B of the present embodiment include sponge. The cushion members 82A and 82B are thicker in the Z direction than the graphite sheets 80A and 80B, and are of about 1 to 2 mm in thickness, for example. The cushion members 82A and 82B are placed at three intersections of the sheet 80Aa, 80Ba and sheets 80Ab, 80Bb. Thus, the thermal-conductive members 78A and 78B have a bank-like bulge 84 formed with the raised graphite sheet 80A, 80B at each of the positions where the cushion members 82A and 82B are placed.

The graphite sheet 80A is attached to the surface side of the back-face defining part 50Aa and middle step 50Ab of the connecting edge 50A. The cushion member 82A and the corresponding bulge 84 are placed at the step 50Ad. The graphite sheet 80B and cushion member 82B are placed at the connecting edge 50B in a position that is symmetrical with the graphite sheet 80A and cushion member 82A.

As illustrated in FIG. 5, in the 180-degree posture, the cushion members 82A and 82B press the graphite sheets

80A and 80B against the spine component 49. Thus, the thermal-conductive members 78A and 78B come into contact with the spine component 49 in the portion where the bulge 84 is located. This results in the first frame member 17A being thermally connected to the second frame member 17B via the graphite sheet 80A, spine component 49 and graphite sheet 80B, so that heat is transported between the first chassis 12A and the second chassis 12B. The bulge 84 comes in contact with the shoulders of the spine component 49, and as the electronic apparatus 10 changes from 0 degrees to 180 degrees, the sliding distance relative to the spine component 49 is short, and the surface of the spine component 49 does not change its quality. As illustrated in FIG. 6, the graphite sheets 80A and 80B are separated from the spine component 49 and not visible to the user when the apparatus is in the 0-degree position.

Next, the following describes the graphite sheets 86, 88, and 90. As described above, the graphite sheets 86, 88, and 90 are stacked on the flexible boards 38, 40, and 42, respectively, at least at locations across the first chassis 12A and the second chassis 12B, and are attached with heat-conductive adhesive tape, for example. The following describes, as a representative example, the graphite sheet 86 and flexible board 38, which are attached to each other. The graphite sheet 86 has a strip shape and has the same width in the X direction as the flexible board 38. The graphite sheet 86 and flexible board 38 attached to each other constitute a laminate 100.

As illustrated in FIG. 5, the graphite sheet 86 and the flexible board 38 are stacked at a position across the first chassis 12A and the second chassis 12B, so that they have the same passing route. This means that the laminate 100 is stored in the space 54 of the first chassis 12A and the corresponding space in the second chassis 12B in an S-shape and inverted S-shape. The graphite sheet 86 and the flexible board 38 are placed in the path between the spine component 49 and the hinge device 14, meaning that they are covered with the spine component 49 on the back face side and are not visible. Their surface side is covered by the display 16.

The laminate 100 extends from the space 54 in the first chassis 12A through the gap between the lower step 50Ac of the connecting edge 50A and the display 16 in the X2 direction. The flexible board 38 exiting this gap is connected to the motherboard 20. The graphite sheet 86 forms a U-shaped folded part 86a, and one end 86b reaches the back face of the lower step 50Ac to be stacked and placed between the heat pipe 60 and the lower step 50Ac via a heat conductive rubber 72 for thermal connection. That is, the one end 86b of the graphite sheet 86 is thermally connected to the thermal module 30 and connecting edge 50A. In this embodiment, the one end 86b of the graphite sheet 86 is placed between the heat pipe 60 and the lower step 50Ac for thermal connection. As long as the thermal connection is maintained, these three components may be stacked in any order. For instance, their stacking order may be changed by changing the path of the graphite sheet 86.

The laminate 100 is placed in the second chassis 12B to be symmetrical to in the first chassis 12A. The other end 86c of the graphite sheet 86 is thermally connected to the frame member 17B and the connecting edge 50B that is a part of the frame member 17B. Thus, the heat of a heating element such as the CPU 20a is transmitted from the thermal module 30 to the heat pipe 60 at the end, and is further transmitted to the one end 86b that is stacked and placed between the heat pipe 60 and the lower step 50Ac. The heat is then transported by the graphite sheet 86 from the first chassis 12A to the second chassis 12B.

As described above, the heat in the heat pipe 60 is transferred from the low step 50Ac to the connecting edge 50A, the first thermal-conductive member 78A, the spine component 49, the second thermal-conductive member 78B, and the connecting edge 50B. These actions allow the electronic apparatus 10 to adjust the temperature balance between the first chassis 12A and the second chassis 12B. Temperature rise in the first chassis 12A is appropriately suppressed, whereby other cooling means such as a fan can be omitted. Omission of mechanical operating elements such as a fan can reduce cost, noise, and thickness of the apparatus.

The following further describes the laminate 100 inside the first chassis 12A and along the hinge body 46. Note that the laminate 100 inside the second chassis 12B is substantially symmetrical to inside the first chassis 12A, so a description thereof will be omitted.

Figure 7:
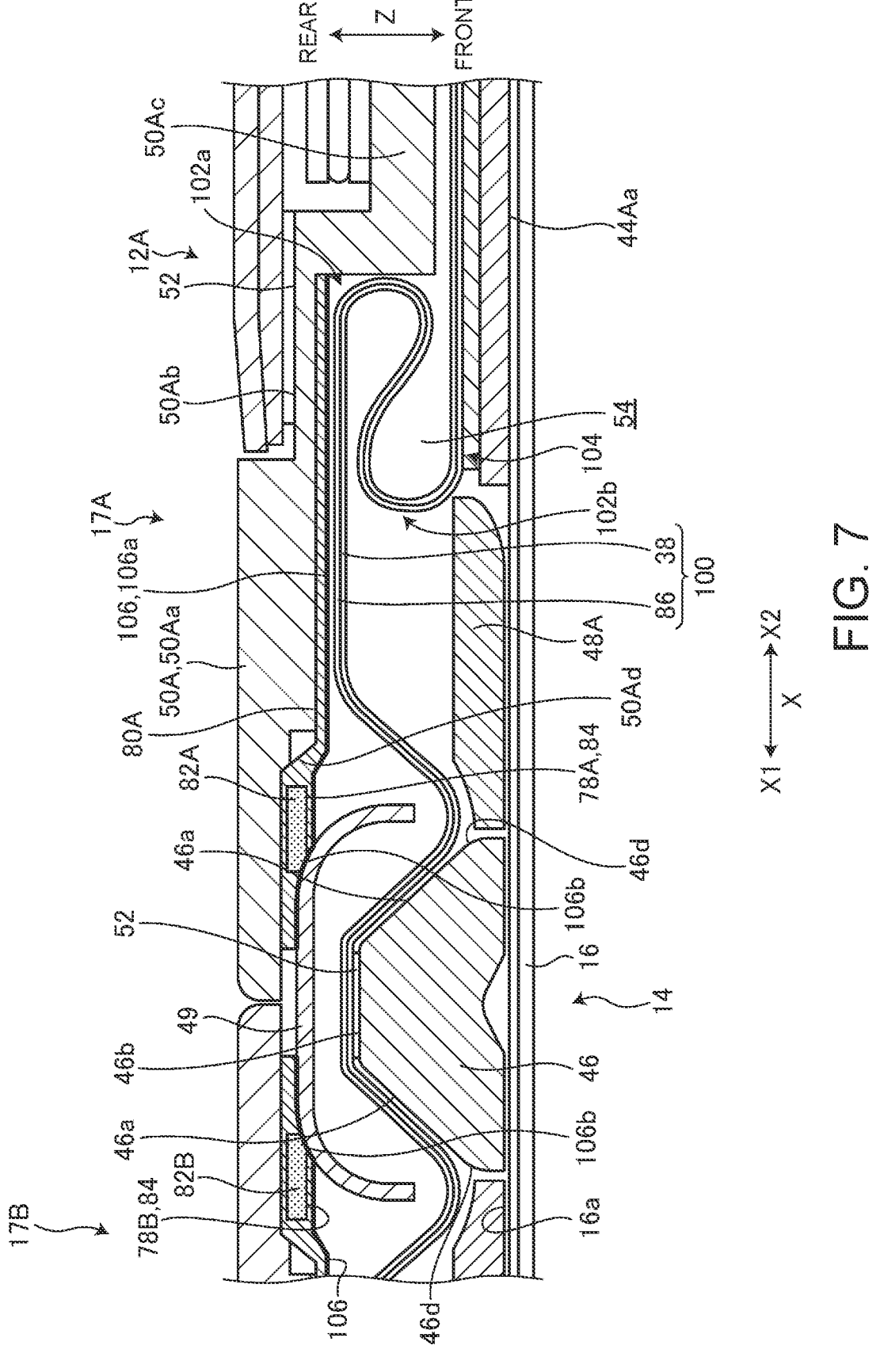
FIG. 7 is a cross-sectional view of the laminate in the space and along the hinge body when the electronic apparatus is in the 180-degree posture.
Figure 8:
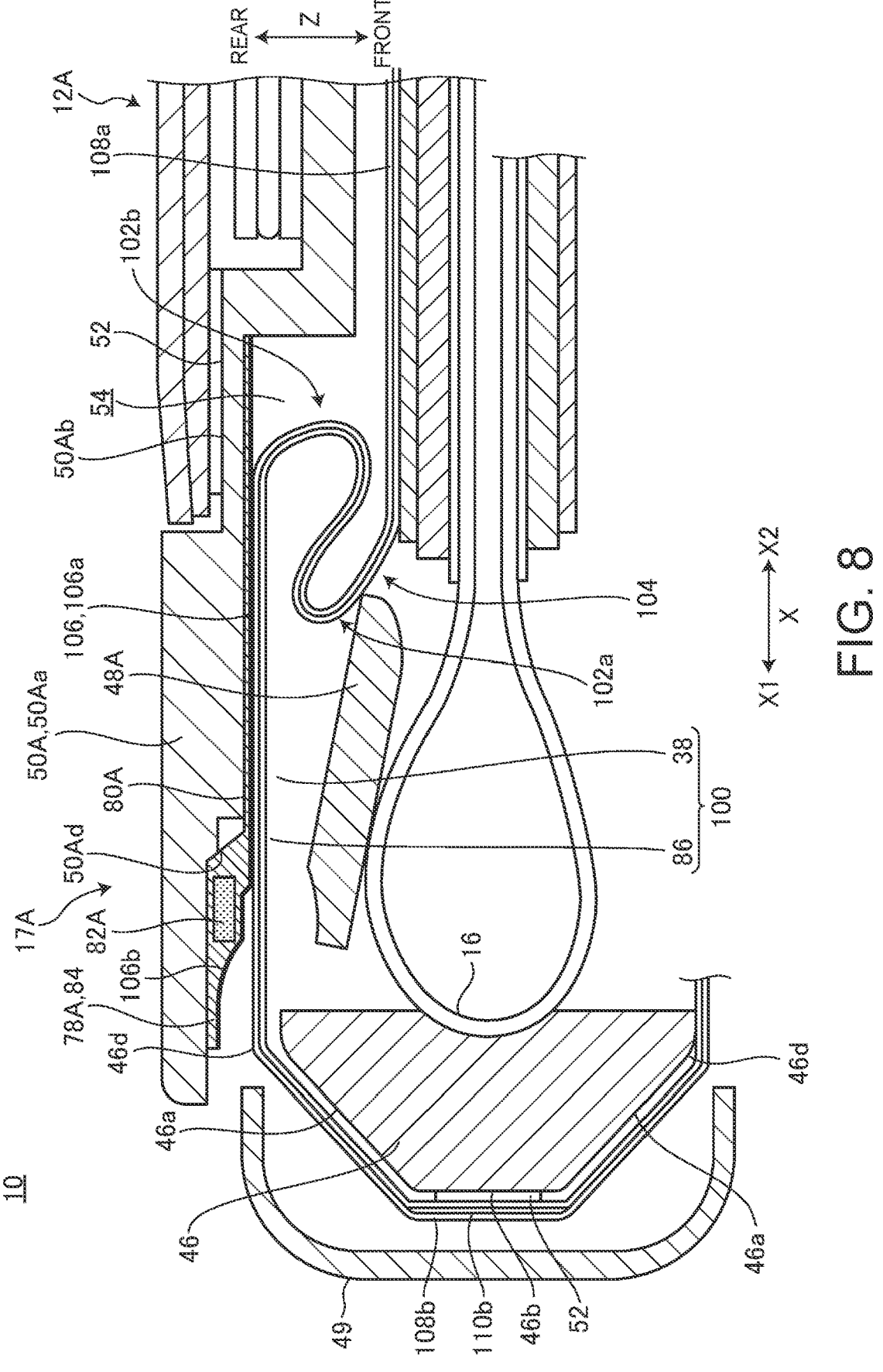
FIG. 8 is a cross-sectional view of the laminate in the space and along the hinge body when the electronic apparatus is in the 0-degree posture.

FIG. 7 is a cross-sectional view of the laminate 100 in the space 54 and along the hinge body 46 when the electronic apparatus is in the 180-degree posture. FIG. 8 is a cross-sectional view of the laminate 100 in the space 54 and along the hinge body 46 when the electronic apparatus is in the 0-degree posture.

In the internal space 54 of the first chassis 12A, the laminate 100 forms a substantially S-shaped surplus length absorbing part 104 having a first folded part 102a and a second folded part 102b that are aligned side by side and curved in opposite directions. The first folded part 102a on the X1 side and the second folded part 102b on the X2 side each define a hairpin curve shape.

In the 180-degree posture (see FIG. 7), the laminate 100 has a short path length that is required because the slope 46a of the hinge body 46 is somewhat close to the space 54, while having a longer path length in the 0-degree posture (see FIG. 8) because the slope 46a is slightly separated from the space 54. In this way, as the electronic apparatus 10 changes the shape from the 0-degree posture to the 180-degree posture, the laminate 100 is configured to follow the change without difficulties due to the surplus length absorbing part 104. In other words, the surplus length absorbing part 104 is slightly larger in the 180-degree posture, while it is slightly smaller in the 0-degree posture. The laminate 100 is fixed to the top surface 46b of the hinge body 46 with adhesive tape 52.

Figure 9:
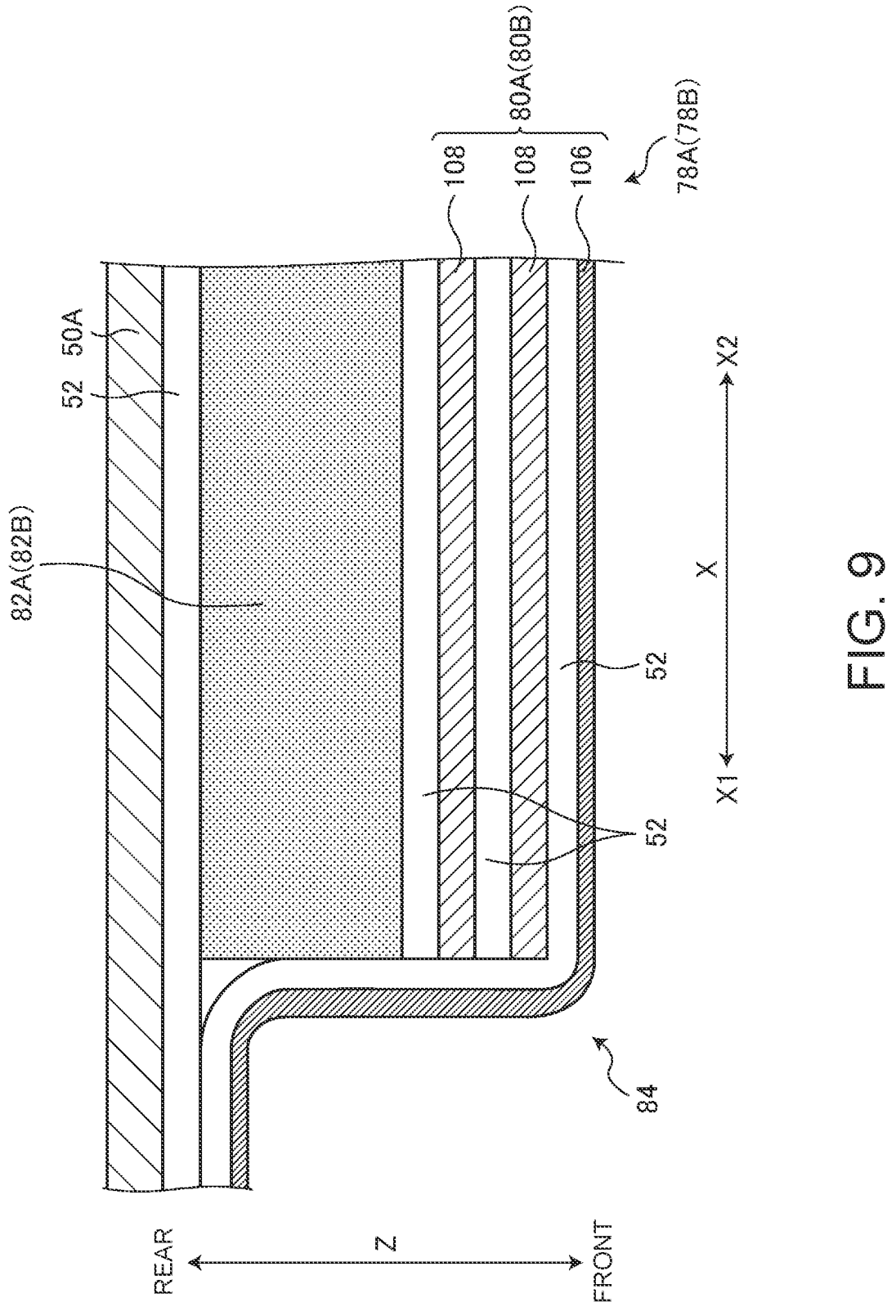
FIG. 9 is a cross-sectional view of the bulge.

The following further describes the first thermal-conductive member 78A. FIG. 9 is a cross-sectional view of the bulge 84 in the first thermal-conductive member 78A. The first thermal-conductive member 78A does not have the cushion member 82A in FIG. 9 at a part other than the bulge 84. The second thermal-conductive member 78B has the same structure.

As illustrated in FIGS. 7 to 9, the graphite sheet 80A of the first thermal-conductive member 78A includes a protective layer 106 made of a sliding material over the entire surface that comes in contact with the spine component 49. The graphite sheet 80A of the present embodiment does not come with a protective layer made of any other material other than the protective layer 106. In FIGS. 7 and 8, the protective layer 106 is schematically illustrated with a bold line. The protective layer 106 has excellent sliding properties, abrasion resistance, and insulation properties, and is made of, for example, Teflon (registered trademark) (polytetrafluoroethylene).

As illustrated in FIG. 9, the cushion member 82A is fixed to the connecting edge 50A with adhesive tape 52. The graphite layer (heat-transfer material layer) 108 is fixed to the surface of the cushion member 82A with the adhesive tape 52. A configuration including two graphite layers 108 bonded together with adhesive tape 52 is suitable from the viewpoint of thermal efficiency, but this may be one layer or three or more layers of the graphite layers. As long as the graphite layer 108 extends to a position covering the cushion member 82A at least on the X1 side, the graphite layer 108 will come in contact with the spine component 49 reliably with a slight amount of pressure because the cushion member 82A is compressed in the 180-degree posture (see FIG. 7).

The protective layer 106 is fixed with the adhesive tape 52 to surround the surface of the graphite layer 108 and the end faces of the graphite layer 108 and the cushion member 82A. That is, the surface and end faces of the graphite layer 108 are covered and protected by the protective layer 106, so that the shape becomes stable and the wear and others are suppressed. The graphite layer 108 has a thickness of about 0.025 mm, and the protective layer 106 has a thickness of about 0.07 mm.

The graphite sheet 80A is surrounded by the protective layer 106 that is a sliding material at the place where it comes in contact with the surplus length absorbing part 104 (the part indicated by reference numeral 106a in FIGS. 7 and 8). This configuration does not generate abnormal noise such as sliding noise when the angle between the chassis changes so that the shape and size of the surplus length absorbing part 104 change and the surplus length absorbing part 104 slides against the graphite sheet 80A, and enables a smooth motion.

The laminate 100 making up the surplus length absorbing part 104 is a stack of graphite sheets 86 on the flexible board 38. The protective layer of this graphite sheet 86 may be made of PET. In this case also, the sliding target is the graphite sheet 80A, and its protective layer 106 is made of a sliding material, which does not generate abnormal noise.

Furthermore, the protective layer 106 at the position where the graphite sheet 80A comes in contact with the spine component 49 (the part indicated by reference numeral 106b in FIGS. 7 and 8) is made of a sliding material. With this configuration, no abnormal sound such as sliding noise occurs for the sliding against the spine component 49, and they move smoothly. The cushion member 82A is placed between the part 106b and the connecting edge 50A of the frame member 17A, and this part 106b slides against the spine component 49 with the change in angle between chassis while being pressed strong to some extent. This part 106b therefore easily generates abnormal noise. However, the protective layer 106 placed has a great effect in reducing the abnormal noise. The graphite sheet 80B also has the same configuration and actions as the graphite sheet 80A described above.

Abnormal noise may occur due to sliding between the graphite sheet coming with the protective layer made of PET and the flexible board. To prevent this, it is possible to attach a separate sliding sheet. An additional sliding sheet placed on top of the PET layer, however, leads to a decrease in heat conductivity, an increase in the number of assembly steps, and an increase in cost. In contrast, the present embodiment includes the protective layer itself that is made of a sliding material. Thus, the present embodiment does not need a separate sliding sheet, and the above inconvenience does not occur. In some design conditions, the flexible boards 38, 40, and 42 may be replaced by other flat cables such as flexible flat cable (FFC). The graphite layer 108 may be replaced by a thermal-conductive member such as copper or aluminum sheet. A sliding material of the protective layer 106 is used for a copper sheet or an aluminum sheet, whereby abnormal noise can be suppressed and insulation properties can be ensured.

The present invention is not limited to the above-described embodiments, and can be modified freely without deviating from the scope of the present invention.

The invention claimed is:

1. An electronic apparatus comprising:

a first chassis and a second chassis that are rotatably connected via a hinge device, the hinge device rotatably connecting the first chassis and the second chassis between a first posture where the first chassis and the second chassis are stacked to be overlaid in their surface normal directions and a second posture where the first chassis and the second chassis are placed side by side in a direction perpendicular to the surface normal directions;

a spine component including a thermal-conductive material, and extending along a first edge of the first chassis, the first edge being adjacent to the second chassis, and a second edge of the second chassis, the second edge being adjacent to the first chassis, the spine component covering a gap between the first edge and the second edge in the first posture, and straddling the first edge and the second edge in the second posture;

a first heat transfer sheet on an inner face of the first chassis, the first heat transfer sheet contacting the spine component in the second posture; and a second heat transfer sheet on an inner face of the second chassis, the second heat transfer sheet contacting the spine component in the second posture, the first heat transfer sheet and the second heat transfer sheet each including a heat-transfer material layer and a protective layer, the protective layer extending over an entire surface of the corresponding heat transfer sheet that faces the spine component and further including a sliding material, the protective layer and the spine component contacting each other.

2. The electronic apparatus according to claim 1, further comprising:

a flat cable extending across the first chassis and the second chassis; and a laminate including a graphite sheet on the flat cable, the laminate extending between the first chassis and the second chassis, wherein:

at least a part of the protective layer of each of the first heat transfer sheet and the second heat transfer sheet contacts the laminate.

3. The electronic apparatus according to claim 1, further comprising a cushion member in each of the first heat transfer sheet and the second heat transfer sheet and configured to be opposed to the corresponding chassis of the first and second chassis at positions where the first heat transfer sheet and the second heat transfer sheet are in contact with the spine component.

4. The electronic apparatus according to claim 1, wherein the sliding material includes polytetrafluoroethylene.

5. The electronic apparatus according to claim 1, wherein the first heat transfer sheet and the second heat transfer sheet each include a graphite sheet.

6. The electronic apparatus according to claim 2, wherein the flat cable includes a flexible board.

* * * * *